US012658569B2

(12) United States Patent
Kamgaing

(10) Patent No.: US 12,658,569 B2
(45) Date of Patent: Jun. 16, 2026

(54) SUBSTRATE WITH A GROUNDED COPLANAR WAVEGUIDE ON A GLASS CORE

(71) Applicant: Intel Corporation, Santa Clara, CA (US)

(72) Inventor: Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 191 days.

(21) Appl. No.: 17/845,830

(22) Filed: Jun. 21, 2022

(65) Prior Publication Data

US 2023/0411838 A1 Dec. 21, 2023

(51) Int. Cl.
| | |
|---|---|
| *H01P 3/00* | (2006.01) |
| *H01P 3/02* | (2006.01) |
| *H01Q 1/38* | (2006.01) |
| *H10W 44/20* | (2026.01) |

(52) U.S. Cl.
CPC .............. *H01Q 1/38* (2013.01); *H01P 3/006* (2013.01); *H10W 44/20* (2026.01); *H01P 3/026* (2013.01); *H10W 44/216* (2026.01); *H10W 44/248* (2026.01)

(58) Field of Classification Search
CPC ... H01Q 1/38; H01L 23/66; H01L 2223/6627; H01L 2223/6677; H01L 21/486; H01L 23/49816; H01L 23/49827; H01L 23/5385; H01L 25/0655; H01L 2224/81; H01L 23/15; H01P 3/006; H01P 3/026; H01P 3/08; H01P 5/19; H01P 9/003; H01P 11/007; H01P 11/008; H01P 3/081; H01P 5/184; H01P 7/082; H01P 1/047; H01P 1/18; H01P 11/001; H01P 11/003; H01P 11/005; H01P 3/06; H01P 3/088; H01P 5/107; H01P 5/18

See application file for complete search history.

(56) References Cited

U.S. PATENT DOCUMENTS

| | | | | |
|---|---|---|---|---|
| 8,581,113 B2* | 11/2013 | Sanjuan | .................. | H01L 24/48 |
| | | | | 257/664 |
| 9,026,061 B2* | 5/2015 | Rofougaran | ............. | H04B 1/40 |
| | | | | 333/260 |
| 2016/0276727 A1* | 9/2016 | Dang | ........................ | H01Q 1/48 |
| 2019/0088603 A1* | 3/2019 | Marimuthu | ............. | H01L 24/20 |

* cited by examiner

*Primary Examiner* — John W Poos
(74) *Attorney, Agent, or Firm* — Schwabe, Williamson & Wyatt, P.C.

(57) ABSTRACT

Embodiments herein relate to systems, apparatuses, techniques or processes directed to a package that include a substrate with a glass core, with one or more grounded coplanar waveguides placed on one or both surfaces of the glass core. The one or more grounded coplanar waveguides may then be used for high-speed communication between two dies, such as a compute die and a memory die, coupled with the substrate. Other embodiments may be described and/or claimed.

26 Claims, 8 Drawing Sheets

SUBSTRATE WITH A GROUNDED COPLANAR WAVEGUIDE ON A GLASS CORE

FIELD

Embodiments of the present disclosure generally relate to the field of package assemblies, and in particular package assemblies that include high speed transmission lines within a substrate.

BACKGROUND

Continued reduction in end product size of mobile electronic devices such as smart phones and ultrabooks is a driving force for the development of reduced size system in package components. Increasing performance requirements continues to increase data communication speeds between dies on packages, for example between computing dies and memory dies.

DETAILED DESCRIPTION

Figures 1A, 1B, 1C:
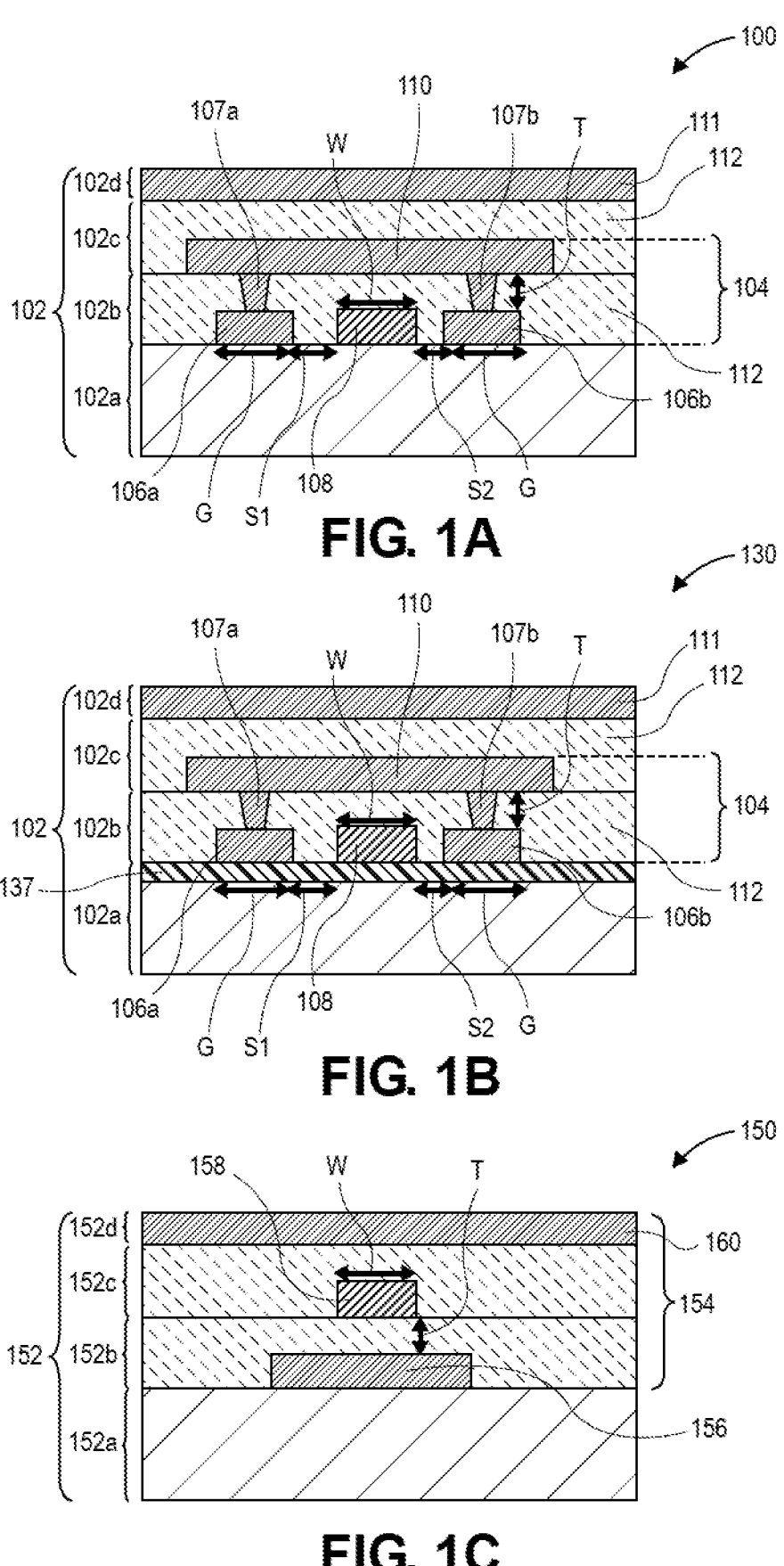
FIGS. 1A-1D illustrate cross section side views of various examples of high-speed transmission lines on a glass core of a substrate, including a grounded coplanar waveguide, in accordance with various embodiments.

Embodiments of the present disclosure may generally relate to systems, apparatus, and/or processes directed to packages that include a substrate with a glass core, with one or more grounded coplanar waveguides placed on a surface of the glass core. In embodiments, grounded coplanar waveguides may be placed on surfaces on both sides of the glass core. In embodiments, a die may be electrically coupled with the substrate, and may be electrically coupled with the one or more coplanar waveguides. In embodiments, the die may be electrically coupled with a coplanar waveguide on a side of the glass core opposite the side of the die. In these embodiments, a vertical electrical routing may pass through the glass core, for example an electrically conductive through glass via (TGV), to electrically couple the die and the coplanar waveguide.

In embodiments, multiple dies, for example but not limited to compute dies and memory dies, may be coupled on the substrate and may be electrically coupled with each other for high-speed transmission using one or more coplanar waveguides. In embodiments, coplanar waveguides on one side of the glass core may be referred to as a top channel or front channel, and coplanar waveguides on the opposite side of the glass core may be referred to as a bottom channel or back channel. In embodiments, the multiple dies may be electrically coupled through the top channel and/or the bottom channel.

Communication and computing platforms increasingly require high-speed communication channels between different dies. In legacy implementations, dies such as computing dies and memory dies may be placed on the same substrate of a package to bring the dies in closer proximity to each other. This may be referred to as a near memory compute configuration. In legacy implementations, this approach may cause the number of substrate layers, or layer count of the substrate, to increase to accommodate additional legacy strip line transmission lines required for high speed signaling between the dies. These legacy implementations increase post package thickness, or Z-height, and cost for manufacturing the package.

In other legacy implementations, a prepackaged or bare memory die may be placed on the same side of the substrate along with a complex compute die, which may be similar to the Foveros™ structure. In legacy implementations, signals routed within close proximity that are not shielded may be subject to cross talk, which may compromise signal integrity.

In legacy implementations where a copper clad laminate (CCL) core is used where high-speed routing is required to pass through the CCL core, large plated through hole (PTH) via diameters that are required by CCL limit the signal density through the core, hence this does not enable high density routing between two dies on the same side of the substrate without increasing the layer count of the substrate and/or the overall package footprint.

Embodiments described herein may increase signal routing density with minimum deterioration of signal integrity. Multiple grounded coplanar waveguides on a glass core may be used to form one or more channels, and multiple channels may be used to increase data communication speeds and to significantly reduce crosstalk between the channels. In embodiments, the glass core may provide for high density vertical transitions through the substrate. In addition, the glass core allows a much tighter pitch and smaller via diameters through the glass core, which allows increased signal density through the glass core. This may reduce the layer count of substrates and/or the package footprint required.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIGS. 1A-1D illustrate cross section side views of various examples of high-speed transmission lines on a glass core of a substrate, including a grounded coplanar waveguide (GCPW), in accordance with various embodiments. FIG. 1A shows a cross section side view 100 of a substrate 102 that includes a GCPW 104 on a glass core 102a of the substrate 102. The GCPW 104 may include a first ground line 106a, a signal line 108, and a second ground line 106b, where the signal line 108 is between the first ground line 106a and the second ground line 106b. The term "line", as in "signal line" or "ground line" is used interchangeably herein with the term "trace", as in "signal trace" or "ground trace". For example, in some embodiments line 108 is a conductive metal trace that is to carry a data signal, while ground lines 106a and 106b are conductive metal traces that are to be electrically coupled to a ground reference. The first ground line 106a, a signal line 108, and second ground line 106b may all be coplanar and may be within a first layer 102b of the substrate 102.

A ground plane 110 may be electrically coupled to the first ground line 106a using one or more electrically conductive vias 107a, and the ground plane 110 may be electrically coupled to the second ground line 106b using one or more electrically conductive vias 107b. At least a portion of the signal line 108 is between the ground plane 110 and the glass core 102a. The signal line 108 is electrically isolated from the first ground line 106a, the second ground line 106b, and the ground plane 110 by an insulator material 112, which may include, for example, a dielectric or ABF film. In embodiments, the ground plane 110 may be in a second layer 102c of the substrate 102. In embodiments, a third layer 102d may be used for other electrical routing 111 or circuitry other than the GCPW 104.

Characteristics of performance of the GCPW 104 may be determined by varying aspects of the GCPW 104. For example varying a width W of the signal line 108, varying a width G of the first ground line 106a or the second ground line 106b, varying a spacing S1 between the first ground line 106a and the signal line 108, varying a spacing S2 between the second ground line 106b and the signal line 108, or varying a distance T between the signal line 108 and the ground plane 110 may be done to alter performance characteristics. The distance T may also be a buildup layer thickness.

FIG. 1B shows a cross section side view 130, which may be similar to cross section side view 100 of FIG. 1A, that includes a buffer layer 137 between the signal line 108 and the ground lines 106a, 106b. In embodiments, the buffer layer 137 may include a dielectric material. In embodiments, the buffer layer 137 may have a coefficient of thermal expansion that is different from a coefficient of thermal expansion for the glass core 102a. In embodiments, a thickness of the buffer layer 137 may range from 2 μm to 15 μm. In embodiments, the buffer layer 137 may be applied to a glass core 102a, and may be applied prior to the processes described with respect to FIG. 6, or prior to stages of manufacturing that include build-up layers on the glass core 102a. In embodiments, buffer layer 137 may be applied to either side of the glass core 102a, or to both sides of the glass core 102a.

FIG. 1C shows a cross section side view 150 of a substrate 152 that includes a strip line 154 on a glass core 152a. A first ground plane 156 may be on the glass core 152a and within a first layer 152b. A signal line 158, with a width W, may be above the first ground plane 156 in a second layer 152c. The first ground plane 156 and the signal line 158 may be separated by a distance T, which may be a buildup layer thickness. A second ground plane 160 may be above the signal line 158 in a third layer 152d. Note that unlike the example of FIG. 1A, a third layer 152d is needed to form the strip line 154.

Figures 1D, 2:
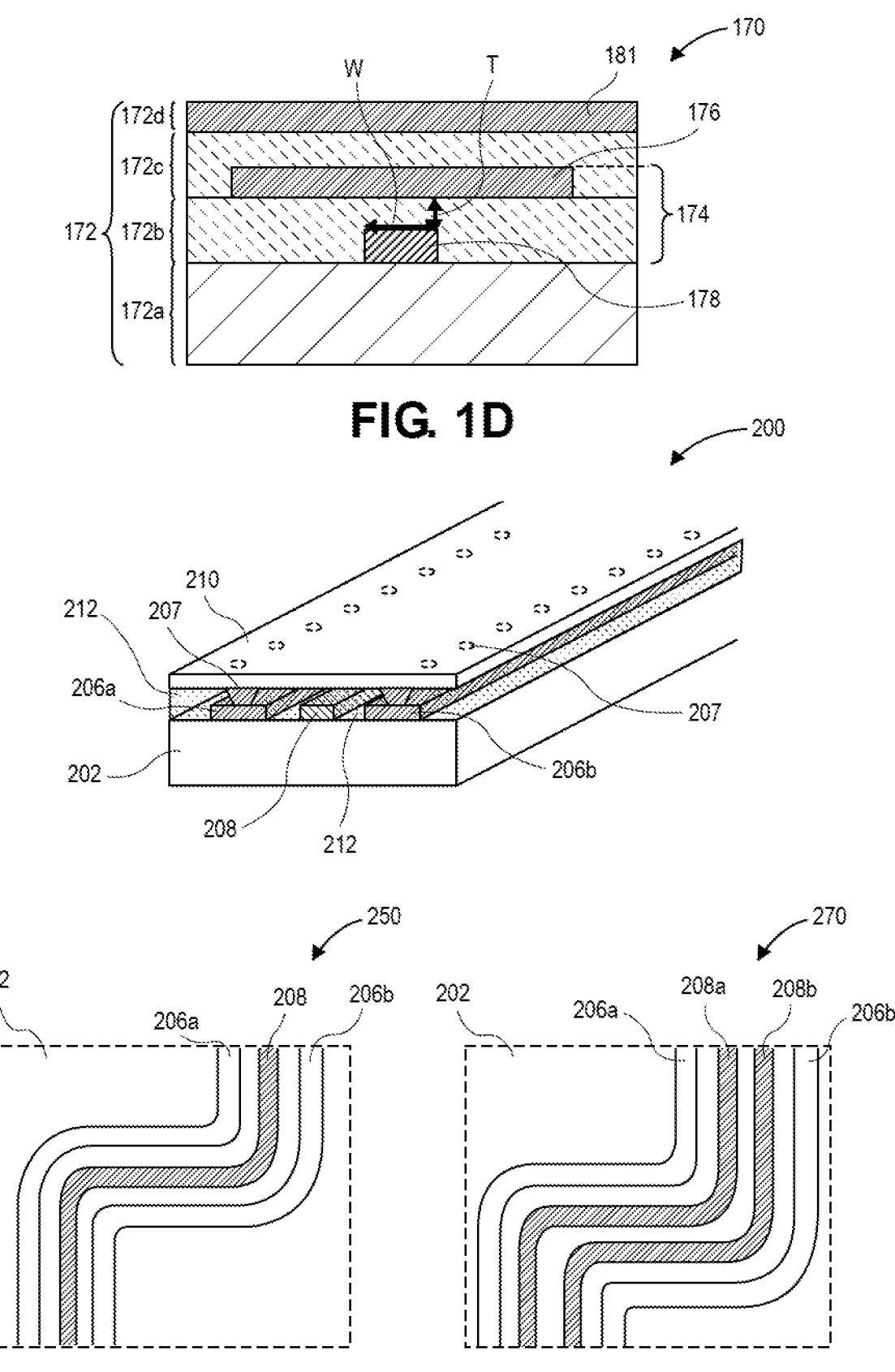
FIG. 2 illustrates a perspective view and top-down cross section views of a grounded coplanar waveguide on a glass core, in accordance with various embodiments.

FIG. 1D shows a cross section side view 170 of a substrate 172 that includes a microstrip 174 on a glass core 172a. In embodiments, microstrip 174 may also be referred to as an embedded microstrip. A signal line 178, with a width W may be on the glass core 172a within a first layer 172b. A ground plane 176 may be in a second layer 172c, above the signal line 178 at a distance T from the signal line 178. The distance T may be a buildup layer thickness. A third layer 172d of the substrate 172 may include routing 181 that is independent of the microstrip 174.

Note that for similar characteristic impedance and a same stackup, an area of the grounded coplanar waveguide 104 may be up to two times smaller than the area of a stripline 154 or microstrip 174.

FIG. 2 illustrates a perspective view and top-down cross section views of a grounded coplanar waveguide (GCPW) on a glass core, in accordance with various embodiments. GCPW 200, which may be similar to the GCPW 104 of FIG. 1A, shows a perspective view that includes a glass core 202 with a signal line 208 on the glass core 202. A first ground line 206a and a second ground line 206b are also on the glass core 202 and on opposite sides of the signal line 208. The glass core 202, signal line 208, first ground line 206a and second ground line 206b may be similar to glass core 102a, signal line 108, first ground line 106a, second ground line 106b of FIG. 1A. In embodiments, the first ground line 206a, the second ground line 206b, and the signal line 208 may be coplanar.

A ground plane 210 electrically couples with the first ground line 206a and the second ground line 206b using conductive vias 207. These may be similar to ground plane 107, and conductive vias 107a, 107b of FIG. 1A. In embodiments, the ground plane 210 may be also referred to as a top ground. An insulator material 212, which may be similar to insulator material 112 of FIG. 1A, may be below ground plane 210, above the glass core 202, and at least partially surrounding the first ground line 206a, second ground line 206b, and signal line 208. The signal line 208 is electrically isolated from the ground plane 210.

Diagrams 250 and 270 show examples of some various routing geometries that may be used in embodiments of GCPW 200. Diagram 250 shows a top-down cross section view of an embodiment of a GCPW 200 that shows a routing on a glass core 202 of a first ground line 206a and a second ground line 206b with a signal line 208. This configuration may be referred to as a single ended GCPW. The signal line 208 may be referred to as a single ended signal line. Diagram 270 shows a top-down cross section view of an embodiment of a GCPW 200 that shows a routing on a glass core 202 of a first ground line 206a and a second ground line 206b, with two signal lines 208a, 208b between them. This configuration may be referred to as a differential GCPW. In embodiments, the two signal lines 208a, 208b may be referred to as a differential signal lines.

Figure 3:
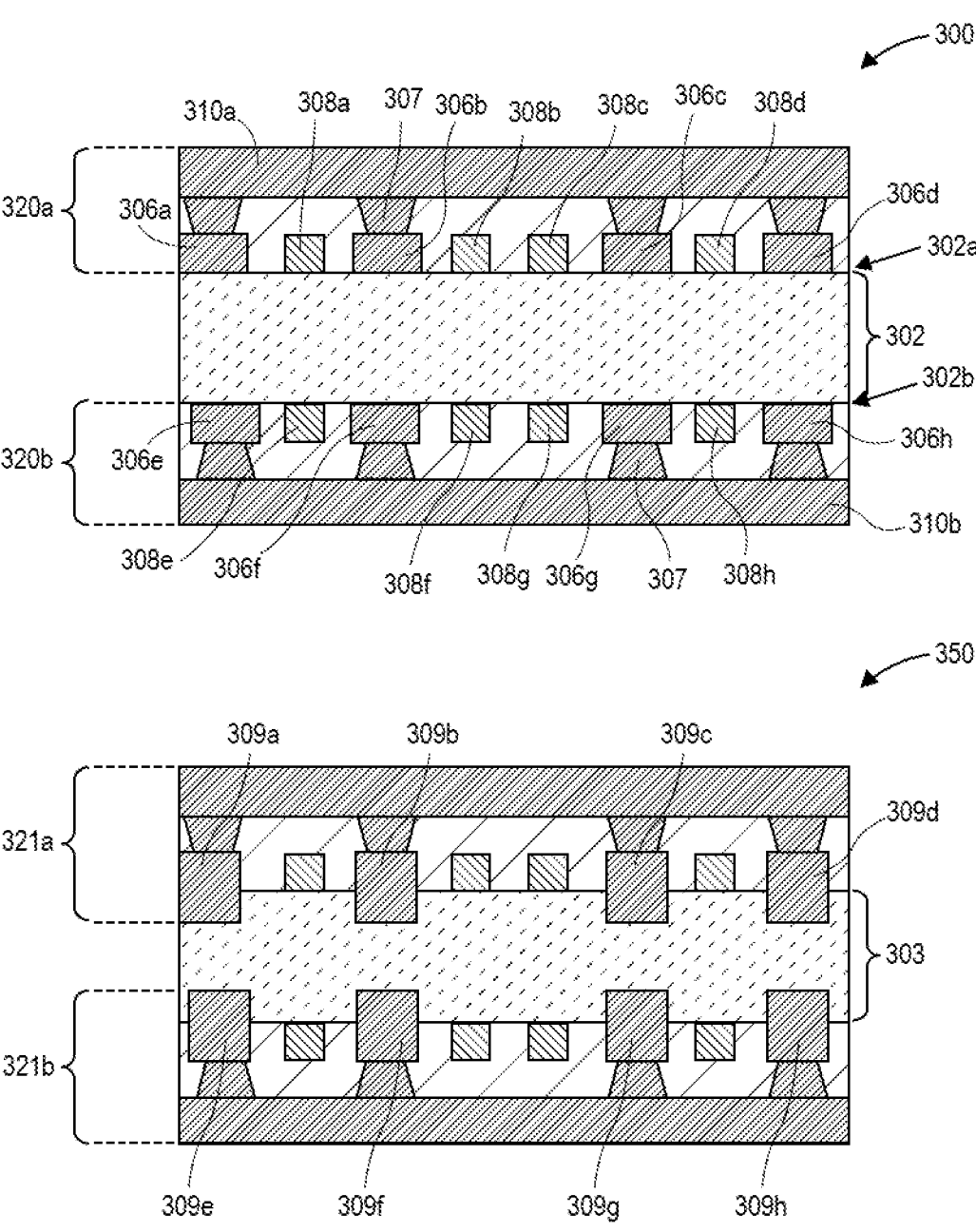
FIG. 3 illustrates cross section side views of a substrate that includes grounded coplanar waveguides on both sides of a glass core of the substrate, in accordance with various embodiments.

FIG. 3 illustrates cross section side views of a substrate that includes grounded coplanar waveguides on both sides of a glass core of the substrate, in accordance with various embodiments. Partial substrate 300 shows a glass core 302 with a first side 302a onto which a first channel 320a may be formed and a second side 302b onto which a second channel 320b may be formed. The first channel 320a and the second channel 320b may include one or more GCPW as discussed further below. Glass core 302 may be similar to glass core 202 of FIG. 2.

The first channel 320a may include grounding lines 306a-306d on the glass core 302 that are electrically coupled with a first ground plane 310a by a plurality of electrically conductive vias 207. Signal lines 308a-308d on the glass core 302 are electrically isolated from the grounding lines 306a-306d. A first GCPW is formed by signal line 308a between ground lines 306a and 306b, a second GCPW is formed by signal lines 308b, 308c that are between ground lines 306b, 306c, and a third GCPW is formed by signal line 308d that is between ground lines 306c and 306d.

The second channel 320b may include 306e-306h on the glass core 302 that are electrically coupled with a second ground plane 310b by a plurality of electrically conductive vias 307. Signal lines 308e-308h on the glass core 302 are electrically isolated from the grounding lines 306e-306h. A first GCPW is formed by signal line 308e between ground lines 306e and 306f, a second GCPW is formed by signal lines 308f, 308g that are between ground lines 306f, 306g, and a third GCPW is formed by signal line 308h that is between ground lines 306g and 306h.

Partial substrate 350, which may be similar to partial substrate 300, has a glass core 303, which may be similar to glass core 302. A first channel 321a is on a first side of the glass core 303 and a second channel 321b is on a second side of the glass core 303. First channel 321a may be similar to first channel 320a and second channel 321b may be similar to second channel 320b. However, unlike partial substrate 300, partial substrate 350 includes ground lines 309a-309h that are recessed into the surface of the glass core 303. In embodiments, a depth of the recess may vary between the thickness of the signal line 308 and half the thickness of the glass core 303. The recessed portion of the ground lines 309a-309h may reduce the cross talk between the different signal lines, for example signal lines 308a-308h of partial substrate 300.

In embodiments, a thickness of the glass core 302 may range between 100 and 200 μm. In embodiments, a thickness of the glass core 302 may be reduced if thin dielectric layers, for example dielectric layers shown with respect to layers 102b, 102c of substrate 102 of FIG. 1A, are 10 μm or less. In embodiments, this recessing into the glass core 303 may be performed by techniques described below with respect to FIG. 6.

In embodiments, for thin glass cores, for example with a thickness of less than 200 μm, signals between the first channel 320a and second channel 320b may be offset to reduce cross talk without resulting in substantial sacrifice to routing density and/or signal speed.

Figure 4:
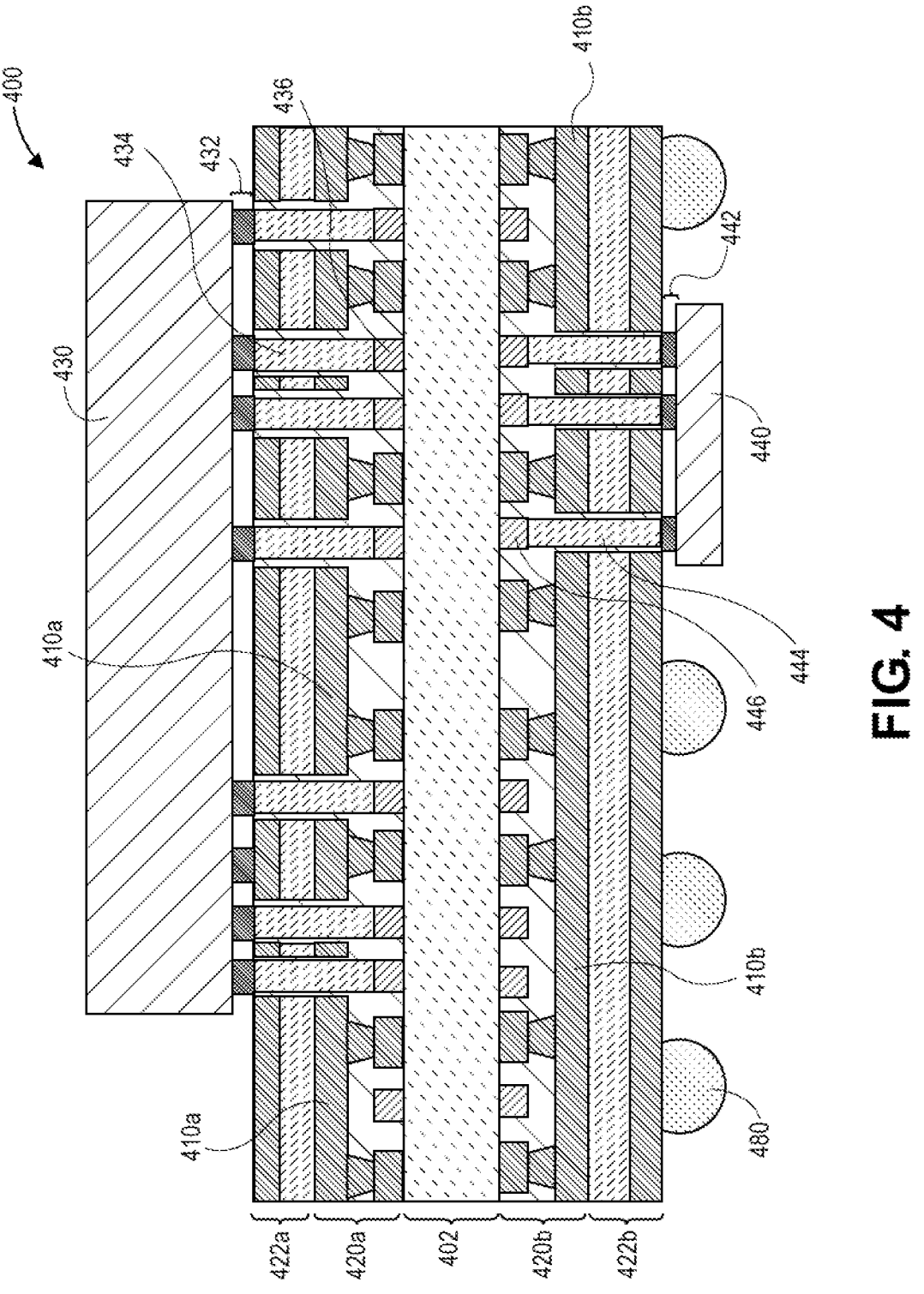
FIG. 4 illustrates a cross section side view of a package that includes grounded coplanar waveguides on both sides of a glass core of a substrate, with a die on either side of the substrate, in accordance with various embodiments.

FIG. 4 illustrates a cross section side view of a package that includes grounded coplanar waveguides on both sides of a glass core of a substrate, with a die on either side of the substrate, in accordance with various embodiments. Package 400 shows a core 402 with a first channel 420a on one side of the core 402 and a second channel 420b on the other side of the core 402. Core 402, first channel 420a, and second channel 420b may be similar to core 302, first channel 320a, and second channel 320b of FIG. 3. In embodiments, a buildup layer 422a may be on the first channel 420a and a buildup layer 422b may be on a second channel 420b.

In embodiments, a first die 430 may be on the first buildup layer 422a and may be electrically coupled with the first channel 420a using connections 432. In embodiments, the connections 432 may be solder bumps. In embodiments, the connections 432 may be electrically coupled with electrically conductive vias that are coupled with electrically conductive vertical connections 434 that may be coupled to signal lines 436, which may be similar to signal lines 308a-308d of FIG. 3. In embodiments, the electrically conductive vertical connections 434 may include electrically conductive vias, and may be electrically isolated with the ground plane 410a, which may be similar to ground plane 310a of FIG. 3. In embodiments, the first die 430 may be a die complex (not shown) that has a base die with multiple chiplets attached to the base die.

Similarly, a second die 440 may be on the second buildup layer 422b and may be coupled using electrical connections 442, which may be solder bumps, using electrically conductive vertical connection 444 to connect with a signal line 446, which may be similar to signal line 436. In embodiments, the electrically conductive vertical connection 444 may be electrically isolated with the ground plane 410b. In embodiments, the second die 440 may be a die complex (not shown) that has a base die with multiple chiplets attached to the base die. In embodiments, the second die 440 may be a thin die that is below a height of solder bumps 480 that may be on the second buildup layer 422*b*. It should be understood that the GCPW in the first channel 420*a* and/or the second channel 420*b* may serve as a breakout layer for high-speed signals either to connect to dies, such as die 430, on a same package or to dies on different packages.

Figure 5:
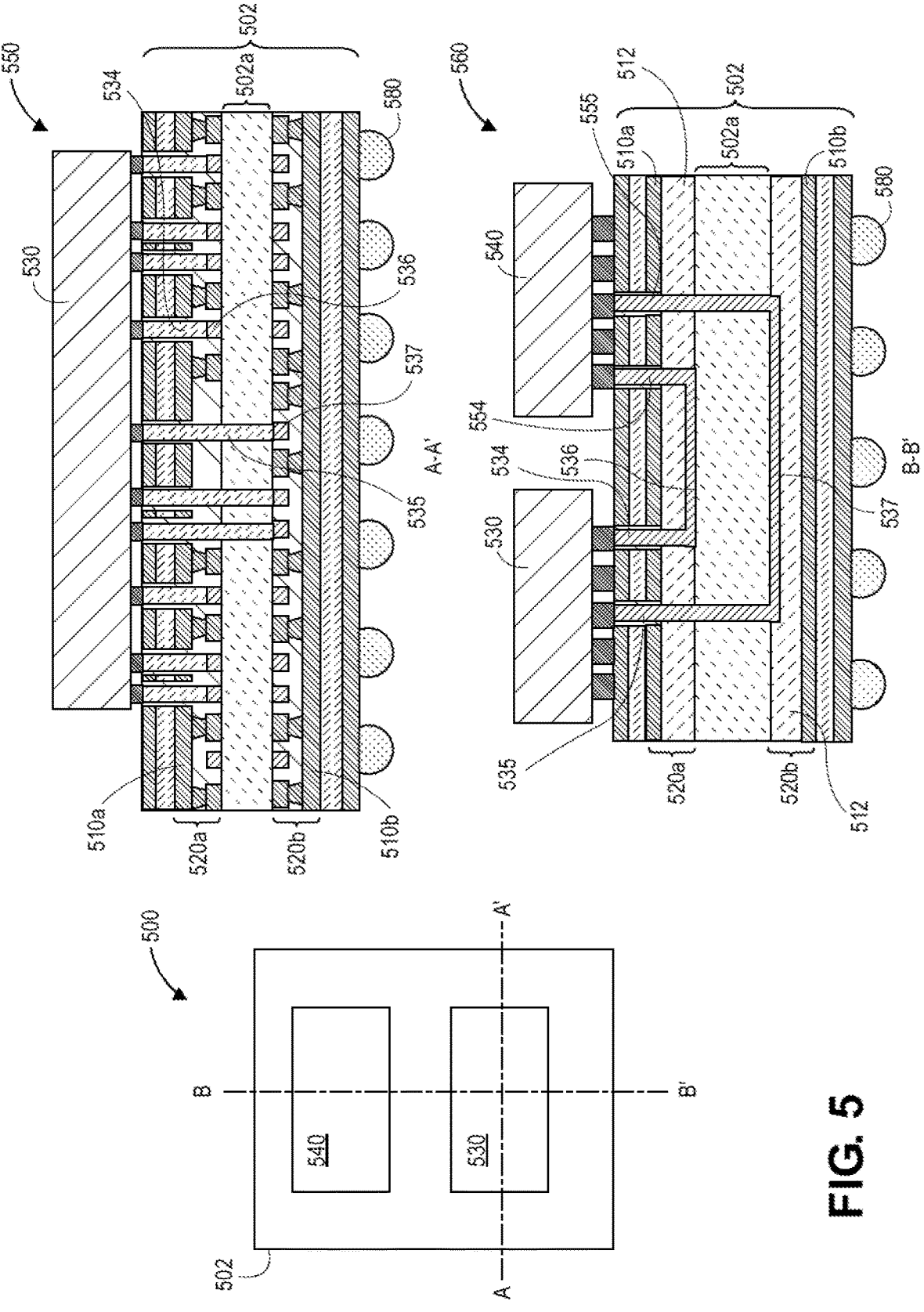
FIG. 5 illustrates a top-down and two cross section side views of a package that includes two dies that are electrically coupled using grounded coplanar waveguides on both sides of a glass core of the package, in accordance with various embodiments.

FIG. 5 illustrates a top-down and two cross section side views of a package that includes two dies that are electrically coupled using grounded coplanar waveguides on both sides of a glass core of the package, in accordance with various embodiments. Diagram 500 shows a top-down illustration of the package, which may be similar to package 400 of FIG. 4, that includes a first die 530 and a second die 540 on the substrate 502, which may be similar to substrate 102 of FIG. 1A. In embodiments, the first die 530 may be a compute die and the second die 540 may be a memory die memory package. In embodiments described below, the first die 530 and the second die 540 are connected using high-speed signals routed on both side of a glass core 502*a*, which may be similar to core 402 of FIG. 4. In embodiments, solder bumps 580 may be on an opposite side of substrate 502.

Diagram 550 shows a cross section side view of diagram 500 at A-A', which includes first die 530 that is coupled with a first side of the substrate 502. In embodiments, there is a first channel 520*a*, which may be similar first channel 420*a* of FIG. 4, that includes multiple GCPW such as GCPW 104 of FIG. 1A, which includes signal line 536, which may be similar to signal line 100 *a* of FIG. 1A. In embodiments, the first die 530 may be electrically coupled with the signal line 536 using an electrically conductive vertical connection 534, which may be similar to electrically conductive vertical connection 434 of FIG. 4.

In addition, the first die 530 may be electrically coupled with a second channel 520*b* on an opposite side of the glass core 502*a* from the first channel 520*a*, by extending a conductive vertical connection 535 through the glass core 502*a*, for example to electrically couple with a signal line 537, for routing through the second channel 520*b*. In this way, high-speed electrical signals may be routed to and from the first die 530 on both sides of the glass core 502*a*.

Diagram 560 shows a cross section side view of diagram 500 at B-B'. High-speed signals are routed between the first die 530 and second die 540 by using electrically conductive vertical connection 534 through signal line 536 and through electrically conductive vertical connection 554 of the first channel 520*a*, and through electrically conductive vertical connection 535 through signal line 537 and through electrically conductive vertical connection 555 of the second channel 520*b*. Ground plane 510*a* is above signal line 536 and separated by insulator material 512, which may be similar to insulator material 112 of FIG. 1A to form a GCPW within first channel 520*a*. Ground plane 510*b* is below signal line 537 and separated by insulator material 512 to form another GCPW in the second channel 520*b*.

In embodiments, with the use of the glass core 502*a*, the vertical connections 535, 555 that extend through the glass core 502*a* may be implemented using through glass vias and build-up layer stacked or staggered vias. As a result, a smaller diameter of via, as well as a tighter pitch between vias, may extend through the glass core 502*a*. Techniques for producing these through glass vias are described in further detail with respect to FIG. 6. Thus, a much higher signal density may be transmitted through the glass core, particularly in comparison to legacy CCL core implementations.

Figure 6:
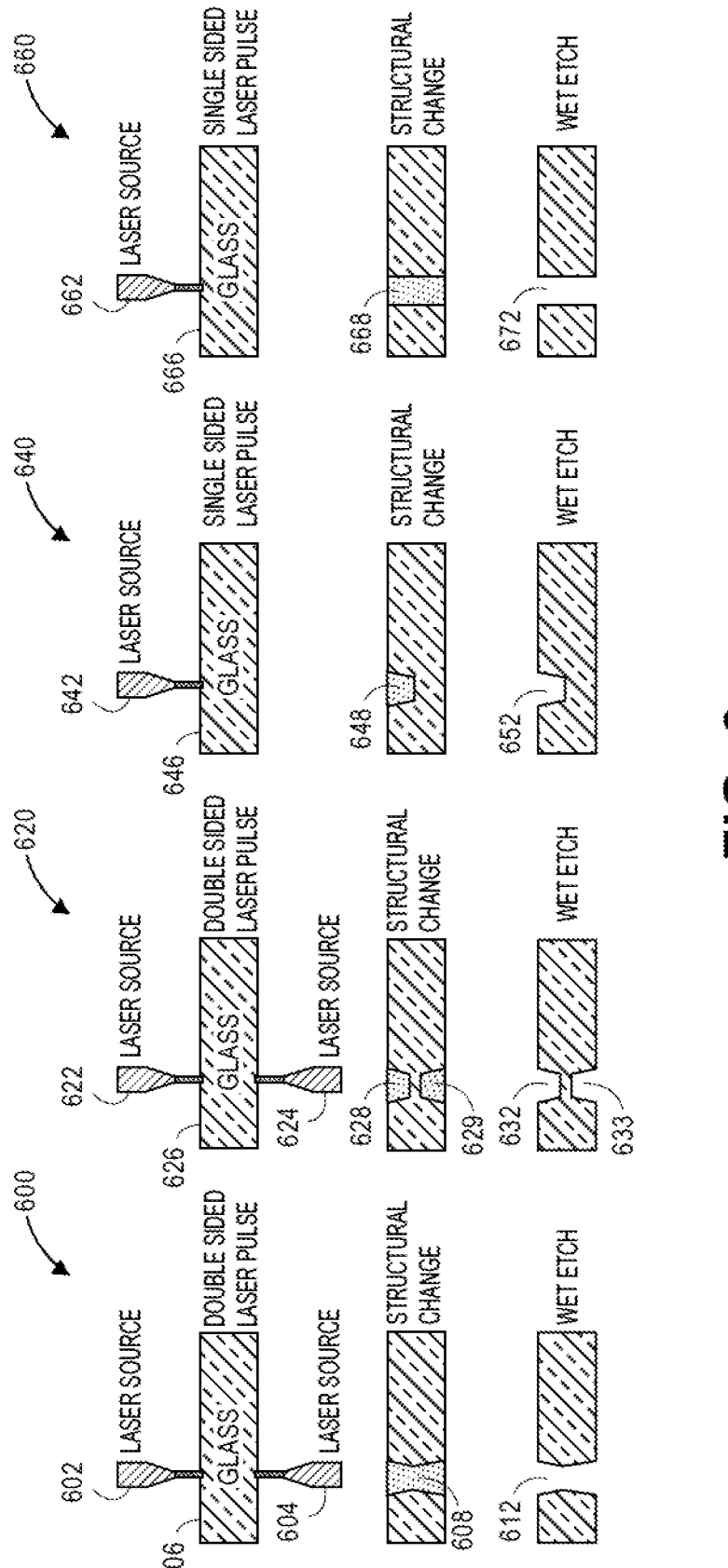
FIG. 6 illustrates multiple examples of laser-assisted etching of glass interconnects processes, in accordance with various embodiments.

FIG. 6 illustrates multiple examples of laser-assisted etching of glass interconnects processes, in accordance with embodiments. The techniques described with respect to FIG. 6 may be used related features shown herein, and in particular with respect to glass core 303 of FIG. 3, and glass core 502*a* with respect to FIG. 5. FIG. 6 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 600 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 612 is created by laser pulses from two laser sources 602, 604 on opposite sides of a glass wafer 606. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 602, 604 are applied perpendicularly to the glass wafer 606 to induce a morphological change 608, which may also be referred to as a structural change, in the glass that encounters the laser pulses. This morphological change 608 includes changes in the molecular structure of the glass to make it easier to etch out (remove a portion of the glass). In embodiments, a wet etch process may be used.

Diagram 620 shows a high level process flow for a double blind shape. A double blind shape 632, 633 may be created by laser pulses from two laser sources 622, 624, which may be similar to laser sources 602, 604, that are on opposite sides of the glass wafer 626, which may be similar to glass wafer 606. In this example, adjustments may be made in the laser pulse energy and/or the laser pulse exposure time from the two laser sources 622, 624. As a result, morphological changes 628, 629 in the glass 626 may result, with these changes making it easier to etch out portions of the glass. In embodiments, a wet etch process may be used.

Diagram 640 shows a high level process flow for a single-blind shape, which may also be referred to as a trench. In this example, a single laser source 642 delivers a laser pulse to the glass wafer 646 to create a morphological change 648 in the glass 646. As described above, these morphological changes make it easier to etch out a portion of the glass 652. In embodiments, a wet etch process may be used.

Diagram 660 shows a high level process flow for a through via shape. In this example, a single laser source 662 applies a laser pulse to the glass 666 to create a morphological change 668 in the glass 666, with the change making it easier to etch out a portion of the glass 672. As shown here, the laser pulse energy and/or laser pulse exposure time from the laser source 662 has been adjusted to create an etched out portion 672 that extends entirely through the glass 666.

With respect to FIG. 6, although embodiments show laser sources 602, 604, 622, 624, 642, 662 as perpendicular to a surface of the glass 606, 626, 646, 666, in embodiments, the laser sources may be positioned at an angle to the surface of the glass, with pulse energy and/or pulse exposure time variations in order to cause a diagonal via or a trench, or to shape the via, such as 612, 672, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 6, through hole vias 612, 672 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias will result in better signaling, allowing more I/O signals to be put through the glass wafer and to other coupled components such as a substrate.

Figure 7:
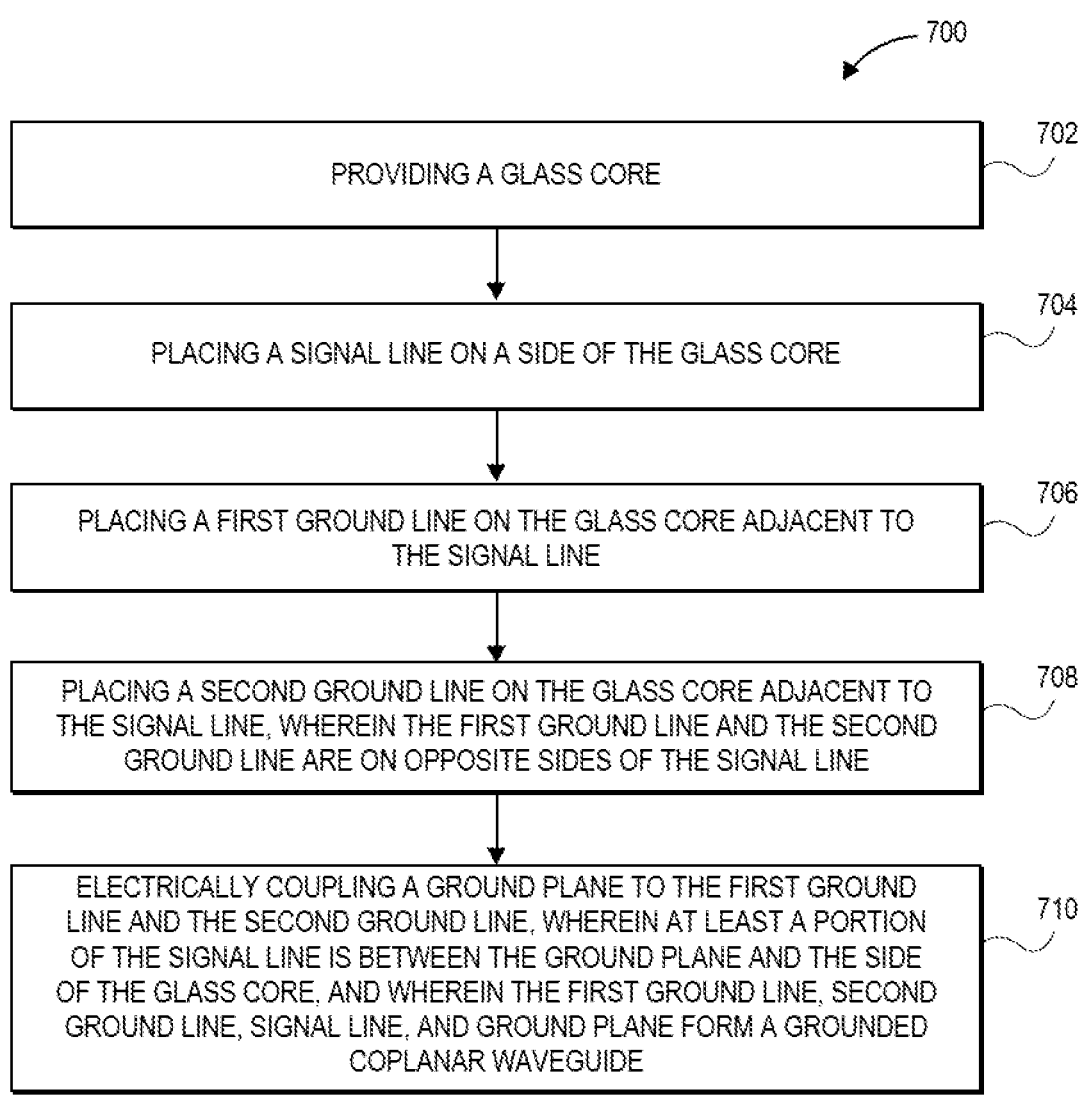
FIG. 7 illustrates an example of a process for manufacturing a substrate with a grounded coplanar waveguide on a glass core, in accordance with various embodiments.

FIG. 7 illustrates an example of a process for manufacturing a substrate with a grounded coplanar waveguide on a glass core, in accordance with various embodiments. Process 700 may be implemented using any of the apparatus, systems, techniques, or processes described herein, and in particular with respect to FIGS. 1-6.

At block 702, the process may include providing a glass core. In embodiments, the glass core may be similar to glass core 102a of FIG. 1A, glass core 202 of FIG. 2, glass cores 302, 303 of FIG. 3, glass core 402 of FIG. 4, or glass core 502a of FIG. 5.

At block 704, the process may further include placing a signal line on a side of the glass core. In embodiments, the signal line may be similar to signal line 108 of FIG. 1A, signal lines 208, 208a, 208b of FIG. 2, signal lines 308a-308h of FIG. 3, signal lines 436, 446 of FIG. 4, or signal lines 536, 537 of FIG. 5.

At block 706, the process may further include placing a first ground line on the glass core adjacent to the signal line. In embodiments, the first ground line may be similar to first ground line 106a of FIG. 1A, first ground line 206a of FIG. 2, or ground lines 306a-306h of FIG. 3.

At block 708, the process may further include placing a second ground line on the glass core adjacent to the signal line, wherein the first ground line and the second ground line are on opposite sides of the signal line. In embodiments, the second ground line may be similar to the second ground line 106b of FIG. 1A, second ground line 206b of FIG. 2, or ground lines 306a-306h of FIG. 3.

At block 710, the process may further include electrically coupling a ground plane to the first ground line and the second ground line, wherein at least a portion of the signal line is between the ground plane and the side of the glass core, and wherein the first ground line, second ground line, signal line, and ground plane form a grounded coplanar waveguide. In embodiments, the ground plane may be similar to ground plane 110 of FIG. 1A, ground planes 310a, 310b of FIG. 3, ground planes 410a, 410b of FIG. 4. In embodiments, the grounded coplanar waveguide may be similar to GCPW 104 of FIG. 1A, or GCPW 200 of FIG. 2, or may be similar to the GCPW found in first channel 320a or second channel 320b of FIG. 3, first channel 420a or second channel 420b of FIG. 4, or first channel 520a or second channel 520b of FIG. 5.

Figure 8:
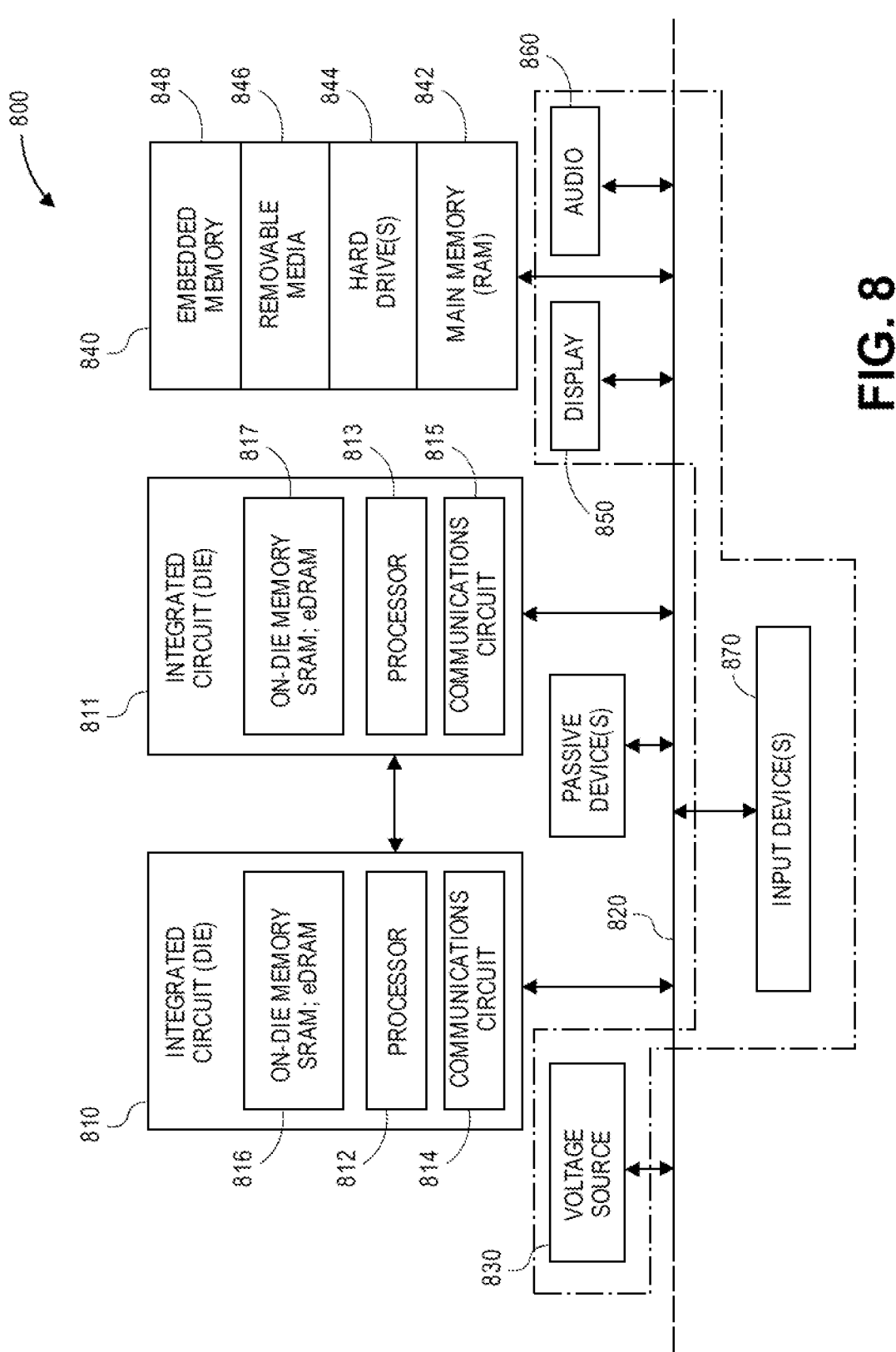
FIG. 8 schematically illustrates a computing device, in accordance with various embodiments.

FIG. 8 is a schematic of a computer system 800, in accordance with an embodiment of the present invention. The computer system 800 (also referred to as the electronic system 800) as depicted can embody a substrate with a grounded coplanar waveguide on a glass core, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a substrate with a grounded coplanar waveguide on a glass core, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having a substrate with a grounded coplanar waveguide on a glass core, according to any of the several disclosed embodiments and their equivalents, an electronic system, a computer system, one or more methods of fabricating an integrated circuit, and one or more methods of fabricating an electronic assembly that includes a package substrate having a substrate with a grounded coplanar waveguide on a glass core, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a substrate with a grounded coplanar waveguide on a glass core embodiments and their equivalents. A foundation substrate may be included, as represented by the dashed line of FIG. 8. Passive devices may also be included, as is also depicted in FIG. 8.

EXAMPLES

The following paragraphs describe examples of various embodiments.

Example 1 is a substrate comprising: a glass core; a signal line on a side of the glass core; a first ground line and a second ground line on the side of the glass core, wherein the first ground line and the second ground line are on opposite sides of the signal line; and wherein the first ground line and the second ground line are electrically coupled with each other, and wherein the first ground line at the second ground line are electrically isolated from the signal line.

Example 2 includes the substrate of example 1, or of any other example or embodiment herein, further comprising a ground plane, wherein the first ground line and the second ground line are electrically coupled with the ground plane.

Example 3 includes the substrate of example 2, or of any other example or embodiment herein, wherein the signal line is between the ground plane and the side of the glass core.

Example 4 includes the substrate of example 3, or of any other example or embodiment herein, wherein the first ground line and the second ground line are electrically coupled with the ground plane with a plurality of vias that are electrically conductive.

Example 5 includes the substrate of example 1, or of any other example or embodiment herein, further comprising a buffer layer between the glass core, the signal line, the first ground line, and the second ground line, wherein the buffer layer includes a dielectric material.

Example 6 includes the substrate of example 5, or of any other example or embodiment herein, wherein a coefficient of thermal expansion for the buffer layer is different from a coefficient of thermal expansion for the glass core.

Example 7 includes the substrate of example 1, or of any other example or embodiment herein, further comprising a material surrounding the signal line, wherein the material is an electrical insulator.

Example 8 includes the substrate of example 1, or of any other example or embodiment herein, wherein the first ground line and the second ground line are recessed into the side of the glass core.

Example 9 includes the substrate of example 8, or of any other example or embodiment herein, wherein a pitch between the first ground line and the second ground line is less than 12 μm.

Example 10 includes the substrate of example 1, or of any other example or embodiment herein, wherein the signal line further includes a first signal line and a second signal line, wherein the first signal line and the second signal line are electrically isolated from each other.

Example 11 includes the substrate of example 1, or of any other example or embodiment herein, wherein the signal line is a first signal line; and further comprising: a second signal line on the side of the glass core, wherein the second signal line is adjacent to the second ground line and on a side of the second ground line opposite the first signal line; a third ground line on the side of the glass core, wherein the second signal line is between the second ground line and the third ground line; and wherein the third ground line is electrically coupled with the second ground line, and wherein second signal line is electrically isolated from the third ground line.

Example 12 includes the substrate of the substrate of example 11, or of any other example or embodiment herein, further comprising a ground plane electrically coupled with the first ground line, the second ground line, and the third ground line, wherein the first signal line and the second signal line are between the ground plane and the side of the glass core.

Example 13 includes the substrate of example 11, or of any other example or embodiment herein, wherein the first ground line, the second ground line, the third ground line, the first signal line, and the second signal line are coplanar.

Example 14 includes the substrate of example 1, or of any other example or embodiment herein, wherein a distance between the first ground line and the signal line is less than 12 μm.

Example 15 is a package comprising: a substrate with a first side and a second side opposite the first side, the substrate including: a core that includes glass, the core having a first side and a second side opposite the first side; a first signal line on the first side of the core; a first ground line and a second ground line on the first side of the core, wherein the first ground line and the second ground line are on opposite sides of the first signal line, wherein the first ground line and the second ground line are electrically coupled by a first ground plane, and wherein the first signal line is electrically isolated from the first ground line and the second ground line; a second signal line on the second side of the core; and a third ground line and a fourth ground line on the second side of the core, wherein the third ground line and the fourth ground line are on opposite sides of the first signal line, wherein the first ground line and the second ground line are electrically coupled by a second ground plane, and wherein the first signal line is electrically isolated from the first ground line and the second ground line.

Example 16 includes the package of example 15, or of any other example or embodiment herein, wherein at least a portion of the first signal line is between the first ground plane and the first side of the core, and wherein at least a portion of the second signal line is between the second ground plane and the second side of the core.

Example 17 includes the package of example 15, or of any other example or embodiment herein, further comprising a buildup layer on the first side of the core.

Example 18 includes the package of example 17, or of any other example or embodiment herein, further comprising a die on a side of the buildup layer, wherein the die is electrically coupled with the first signal line on the first side of the core.

Example 19 includes the package of example 18, or of any other example or embodiment herein, wherein the die is electrically coupled with the second signal line on the second side of the core, wherein at least a portion of the electrical coupling extends through the core.

Example 20 includes the package of example 18, or of any other example or embodiment herein, wherein the die is a first die; and further comprising a second die on the side of the buildup layer, wherein the first die is electrically coupled with the second die through the first signal line on the first side of the core or through the second signal line on the second side of the core.

Example 21 includes the package of example 18, or of any other example or embodiment herein, wherein the buildup layer is a first buildup layer, and wherein the die is a first die; and further comprising: a second buildup layer on the second side of the core; a second die on the second buildup layer, wherein the second die is electrically coupled with the second signal line on the second side of the core.

Example 22 includes the package of example 21, or of any other example or embodiment herein, wherein the first die is electrically coupled with the second die through the first signal line on the first side of the core or through the second signal line on the second side of the core.

Example 23 is a method comprising: providing a glass core; placing a signal line on a side of the glass core; placing a first ground line on the glass core adjacent to the signal line; placing a second ground line on the glass core adjacent to the signal line, wherein the first ground line and the second ground line are on opposite sides of the signal line; and electrically coupling a ground plane to the first ground line and the second ground line, wherein at least a portion of the signal line is between the ground plane and the side of the glass core, and wherein the first ground line, second ground line, signal line, and ground plane form a grounded coplanar waveguide.

Example 24 includes the method of example 23, or of any other example or embodiment herein, further comprising forming a buildup layer on the side of the glass core.

Example 25 includes the method of example 24, or of any other example or embodiment herein, further comprising coupling a die to a side of the buildup layer, wherein the die is electrically coupled with the signal line on the side of the glass core.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A substrate comprising:
   a glass core;
   a first trace on a side of the glass core;
   a second trace and a third trace on the side of the glass core, wherein the second trace and the third trace are on opposite sides of the first trace;
   wherein the second trace and the third trace are electrically coupled with each other, and wherein the second trace and the third trace are electrically isolated from the first trace; and
   a ground plane, wherein the second trace and the third trace are electrically coupled with the ground plane, and wherein the first trace is between the ground plane and the side of the glass core.

2. The substrate of claim 1, wherein the second trace and the third trace are electrically coupled with the ground plane by a plurality of conductive vias.

3. The substrate of claim 1, further comprising a dielectric layer between the glass core, the first trace, the second trace, and the third trace.

4. The substrate of claim 3, wherein a coefficient of thermal expansion for the dielectric layer is different from a coefficient of thermal expansion for the glass core.

5. The substrate of claim 1, further comprising a material surrounding the first trace, wherein the material is an electrical insulator.

6. The substrate of claim 1, wherein the second trace and the third trace are recessed into the side of the glass core.

7. The substrate of claim 6, wherein a distance between the second trace and the third trace is less than 12 μm.

8. The substrate of claim 1, wherein the first trace comprises a first signal line and a second signal line, wherein the first signal line and the second signal line are electrically isolated from each other.

9. The substrate of claim 1, wherein the first trace is a first signal line; and further comprising:

a second signal line on the side of the glass core, wherein the second signal line is adjacent to the third trace and on a side of the third trace opposite the first signal line;

a fourth trace on the side of the glass core, wherein the second signal line is between the third trace and the fourth trace; and wherein the fourth trace is electrically coupled with the third trace, and wherein the second signal line is electrically isolated from the fourth trace.

10. The substrate of claim 9, further comprising a ground plane electrically coupled with the second trace, the third trace, and the fourth trace, wherein the first signal line and the second signal line are between the ground plane and the side of the glass core.

11. The substrate of claim 9, wherein the second trace, the third trace, the fourth trace, the first signal line, and the second signal line are coplanar.

12. The substrate of claim 1, wherein a distance between the second trace and the first trace is less than 12 μm.

13. A package comprising:

a substrate with a first side and a second side opposite the first side, the substrate including:

a core that includes glass, the core having a first side and a second side opposite the first side;

a first signal line on the first side of the core;

a first ground line and a second ground line on the first side of the core, wherein the first ground line and the second ground line are on opposite sides of the first signal line, wherein the first ground line and the second ground line are electrically coupled by a first ground plane, and wherein the first signal line is electrically isolated from the first ground line and the second ground line;

a second signal line on the second side of the core; and a third ground line and a fourth ground line on the second side of the core, wherein the third ground line and the fourth ground line are on opposite sides of the first signal line, wherein the first ground line and the second ground line are electrically coupled by a second ground plane, and wherein the first signal line is electrically isolated from the first ground line and the second ground line.

14. The package of claim 13, wherein at least a portion of the first signal line is between the first ground plane and the first side of the core, and wherein at least a portion of the second signal line is between the second ground plane and the second side of the core.

15. The package of claim 13, further comprising a buildup layer on the first side of the core.

16. The package of claim 15, further comprising a die on a side of the buildup layer, wherein the die is electrically coupled with the first signal line on the first side of the core.

17. The package of claim 16, wherein the die is electrically coupled with the second signal line on the second side of the core, wherein at least a portion of the electrical coupling extends through the core.

18. The package of claim 16, wherein the die is a first die; and further comprising a second die on the side of the buildup layer, wherein the first die is electrically coupled with the second die through the first signal line on the first side of the core or through the second signal line on the second side of the core.

19. The package of claim 16, wherein the buildup layer is a first buildup layer, and wherein the die is a first die; and further comprising:

a second buildup layer on the second side of the core;

a second die on the second buildup layer, wherein the second die is electrically coupled with the second signal line on the second side of the core.

20. The package of claim 19, wherein the first die is electrically coupled with the second die through the first signal line on the first side of the core or through the second signal line on the second side of the core.

21. A substrate comprising:

a glass core;

a first trace on a side of the glass core;

a second trace and a third trace on the side of the glass core, wherein the second trace and the third trace are on opposite sides of the first trace;

wherein the second trace and the third trace are electrically coupled with each other, and wherein the second trace and the third trace are electrically isolated from the first trace; and a dielectric layer between the glass core, the first trace, the second trace, and the third trace, wherein a coefficient of thermal expansion for the dielectric layer is different from a coefficient of thermal expansion for the glass core.

22. A substrate comprising:

a glass core;

a first trace on a side of the glass core;

a second trace and a third trace on the side of the glass core, wherein the second trace and the third trace are on opposite sides of the first trace; and wherein the second trace and the third trace are electrically coupled with each other, and wherein the second trace and the third trace are electrically isolated from the first trace, wherein the second trace and the third trace are recessed into the side of the glass core.

23. The substrate of claim 22, wherein a distance between the second trace and the third trace is less than 12 μm.

24. A substrate comprising:

a glass core;

a first trace on a side of the glass core;

a second trace and a third trace on the side of the glass core, wherein the second trace and the third trace are on opposite sides of the first trace; and wherein the second trace and the third trace are electrically coupled with each other, and wherein the second trace and the third trace are electrically isolated from the first trace,, wherein the first trace is a first signal line; and further comprising:

a second signal line on the side of the glass core, wherein the second signal line is adjacent to the third trace and on a side of the third trace opposite the first signal line;

a fourth trace on the side of the glass core, wherein the second signal line is between the third trace and the fourth trace; and wherein the fourth trace is electrically coupled with the third trace, and wherein the second signal line is electrically isolated from the fourth trace.

25. The substrate of claim 24, further comprising a ground plane electrically coupled with the second trace, the third trace, and the fourth trace, wherein the first signal line and the second signal line are between the ground plane and the side of the glass core.

26. The substrate of claim 24, wherein the second trace, the third trace, the fourth trace, the first signal line, and the second signal line are coplanar.

* * * * *